United States Patent [19]

Larsen et al.

[11] Patent Number: 5,440,159

[45] Date of Patent: Aug. 8, 1995

[54] SINGLE LAYER POLYSILICON EEPROM HAVING UNIFORM THICKNESS GATE OXIDE/CAPACITOR DIELECTRIC LAYER

[75] Inventors: Bradley J. Larsen, Woodland Park; Todd A. Randazzo, Colorado Springs, both of Colo.; Geoffrey S. Gongwer, Campbell, Calif.

[73] Assignee: Atmel Corporation, San Jose, Calif.

[21] Appl. No.: 357,525

[22] Filed: Dec. 16, 1994

Related U.S. Application Data

[63] Continuation of Ser. No. 123,919, Sep. 20, 1993, abandoned.

[51] Int. Cl.[6] .................... H01L 29/68; H01L 29/78
[52] U.S. Cl. .................................. 257/318; 257/300; 257/321; 365/185
[58] Field of Search ............... 257/314, 315, 318, 316, 257/321, 322, 296, 298, 300; 365/184, 185

[56] References Cited

U.S. PATENT DOCUMENTS

| | | | |
|---|---|---|---|
| 4,288,863 | 9/1981 | Adam | 257/320 |
| 4,807,003 | 2/1989 | Mohammadi et al. | 257/318 |
| 4,823,316 | 4/1989 | Riva | 365/185 |
| 4,935,790 | 6/1990 | Cappelletti et al. | 257/318 |
| 5,081,054 | 1/1992 | Wu et al. | 437/43 |
| 5,132,239 | 7/1992 | Ghezzi et al. | 437/43 |
| 5,282,161 | 1/1994 | Villa | 365/185 |

*Primary Examiner*—Jerome Jackson
*Assistant Examiner*—John Guay
*Attorney, Agent, or Firm*—Schneck & McHugh

[57] ABSTRACT

An EEPROM transistor fabricated with a single polysilicon layer. An MOS transistor is fabricated with a subsurface electrode region defined by a stripe in a first direction. A layer of thin oxide is arranged in a second stripe, perpendicular to the first stripe and a polysilicon layer, arranged in a third stripe is disposed over the second stripe of thin oxide. An adjoining parallel plate capacitor is formed by a subsurface region of the same conductivity type as the subsurface electrodes in the first stripe. An insulative second plate of thin oxide is joined to the second stripe and a third plate of the capacitor is formed by a polysilicon plate over the oxide plate. Vertical metallization stripes in the first direction may contact with some components, while parallel metal stripes in a second layer in a perpendicular direction may contact with the remaining members. The stripe geometry allows lateral and vertical four-way symmetry for implementation of a large number of memory storage cells on a chip or wafer.

12 Claims, 3 Drawing Sheets

SINGLE LAYER POLYSILICON EEPROM HAVING UNIFORM THICKNESS GATE OXIDE/CAPACITOR DIELECTRIC LAYER

This is a continuation of application Ser. No. 08/123,919 filed on Sep. 20, 1993, now abandoned.

TECHNICAL FIELD

The invention relates to the construction of EEPROM transistors and data cells including such transistors.

BACKGROUND ART

EEPROM transistors have become increasingly popular for non-volatile memory applications, including data cards and logic applications where small amounts of memory might be needed for logic configuration or initialization. One of the problems in constructing EEPROMs, previously recognized by others, is that two layers of polysilicon are normally used, which increases process complexity and cost. A first layer is used for the floating gate. A second layer is used as the sense gate over the floating gate and for an adjacent select transistor. For example, see U.S. Pat. No. 4,833,096 to J. Y. Huang.

Others have previously constructed single layer EEPROM transistors to overcome the fabrication complexities of two polysilicon layers, for example, U.S. Pat. No. 4,807,003 to Mohammadi et al. Other patents showing similar structures are U.S. Pat. No. 4,823,316 to C. Riva and U.S. Pat. No. 4,935,790 to P. Cappelletti et al. The prior art recognized that a capacitive function served by the sense gate of a two-polysilicon layer EEPROM could be mimicked by a lateral capacitor constructed adjacent to an MOS transistor.

At first glance, it would appear that construction of a lateral capacitor would greatly increase chip size because a capacitor might be bigger than an EEPROM transistor and so a single layer EEPROM would have at least double the chip area of a two-layer polysilicon EEPROM transistor. However, an advantage of single layer poly EEPROM transistors over two-layer polysilicon EEPROM cells is less process complexity and cost in specific applications.

An object of the invention was to devise a more efficient single layer EEPROM transistor and cell using a low programming voltage.

SUMMARY OF INVENTION

The above object has been met with an EEPROM cell which features an MOS transistor with a connected side-by-side capacitor. A polysilicon layer used in the transistor to form the gate of the device is extended to form one of the parallel plates of an adjacent parallel plate capacitor. Both the transistor and the capacitor have a thin oxide insulative region separating the polysilicon layer from a subsurface N buried layer which forms electrodes for the transistor and the second parallel plate for the capacitor. The capacitor is made as large as required to achieve a desired gate capacitive coupling ratio. Since most of the floating gate capacitance is coupling capacitance of the capacitor, the voltage across the polysilicon layer to the buried N+ diffusion is very low.

The capacitor employed with the MOS transistor of the present invention has parallel conductive plates separated by very thin oxide, which may be equal in thickness to the tunnel oxide of the transistor. In applications with very stringent high temperature data retention requirements, the oxide in the coupling capacitor also may be made thicker (i.e. the thickness of the select transistor oxide), but this will require more area to achieve the same coupling ratio. In either case, this simplifies construction because the same oxide layering process used for the transistor and subsequent polysilicon layer deposition is also used for the capacitor.

The combination of an MOS transistor and a side-by-side capacitor sharing a very thin oxide layer of common thickness yields an EEPROM with low programming voltage.

BEST MODE FOR CARRYING OUT THE INVENTION

Figure 1:
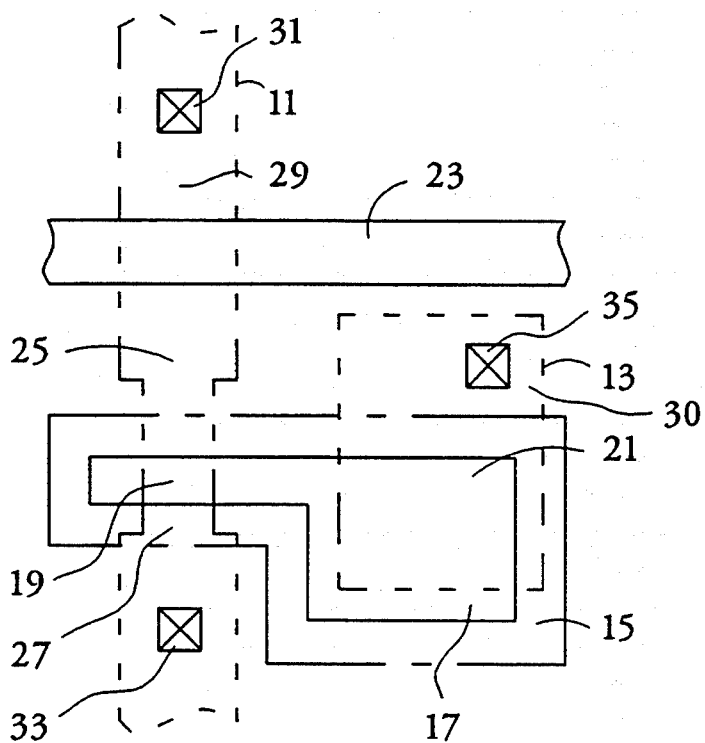
FIG. 1 is a top plan view of a simplified version of an EEPROM cell in accord with the present invention.

With reference to FIG. 1, an N type active layer is indicated by vertical stripe 11, illustrated with dashed lines. This stripe forms an active region where electrodes will be defined for an EEPROM transistor and a select transistor which together form a data cell for a single binary bit. The stripe of N-type active material is diffused or implanted into a P-type substrate of a semiconductor wafer. Spaced apart from stripe 11 is a rectangle 13 of N-type buried material, also buried in the substrate and fabricated at the same time as stripe 11 by means of masking and diffusion or implantation. Rectangle 13 is illustrated by dashed lines. The rectangle 13 will form a plate of a parallel plate capacitor associated with an EEPROM transistor.

Immediately above the substrate is a very thin oxide layer 15, approximately 80 angstroms thick. This layer extends partially over the N-type buried rectangle 13 and a portion of stripe 11. In some applications, it may be desirable to limit the thin oxide region to just the portion over the N-type active region 11, leaving the capacitor oxide thicker at the expense of area. In either case, the portion of the thin oxide layer which is over the rectangle 13 forms the central insulative region of a parallel plate capacitor.

Over the oxide layer, a polysilicon layer 17 generally follows the outline of the thin oxide layer 15, except with smaller dimensions so as to ensure that all 10 oxide between 11 and 17, and all oxide between 13 and 17, is "thin" tunnel oxide. The function of the polysilicon layer 17 is two-fold. First, a gate portion 19 intersects the underlying active layer stripe 11. A second portion forms an upper plate 21 of the parallel plate capacitor previously mentioned. Both portions of the polysilicon layer 17 are fabricated in the same step and have the same polysilicon compositional characteristics.

At the same time that polysilicon layer 17 is deposited to form gate portion 19 and parallel plate portion 21, a polysilicon stripe 23 is deposited as the gate of a select transistor. Beneath the polysilicon stripe 23 an oxide layer has been grown several hundred angstroms thick.

The intersection of polysilicon feature 23 and active feature 11 with this oxide layer form the select transistor. The masking layer used for forming the polysilicon gate portion 19 and the parallel plate portion 21 is used to form stripe 23 so that a single polysilicon deposition suffices for forming the select transistor as well as the sense or storage transistor. Once the polysilicon layer has been deposited, N+ implants may be used to form electrode structures. In particular, an N+ implant in region 25 between polysilicon stripe 23 and polysilicon gate portion 19 forms a shared electrode between the two transistors associated with the two gates. Note that the implant region 25 is self-aligned with the two gates formed by stripe 23 and gate portion 19, since the gates act as a mask. If the electrode associated with implant region 25 is considered to be a drain for gate portion 19, the shared implant region is considered to be a source for the gate associated with polysilicon stripe 23.

A second implant region 27 on a side of gate portion 19 opposite the first implant region 25 serves as a source electrode for the sense transistor. A third implant region 29 serves as the second or drain electrode for the select transistor associated with the gate formed by polysilicon stripe 23. A fourth implant region 30 serves as the contact area for the bottom capacitor plate. The first, second, third and fourth implant regions are all N+ regions which may all be formed at the same time. A first contact 31 is made with the select transistor drain for a bit line. A second contact 33 is for a circuit bias connection to $V_{SS}$ and a third contact 35 is a sense gate connection through the parallel plate capacitor.

Figure 2:
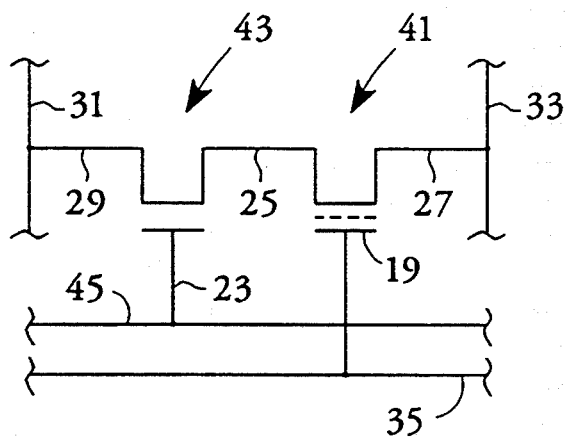
FIGS. 2 and 3 are electrical diagrams of EEPROM circuits in accord with the present invention.

The two transistors are seen in the circuit diagram of FIG. 2. The sense transistor 41 has gate electrode 19, drain electrode 25 and source electrode 27. The sense gate third contact 35 is shown as a line while the second contact 33, connected to source 27 is also shown as a line. The select transistor 43 has its source in common with the drain of transistor 41 and a drain electrode 29 connected to the first contact 31, here shown as a line. The gate electrode 23 of transistor 43 is connected to a row select line 45.

Figure 3:
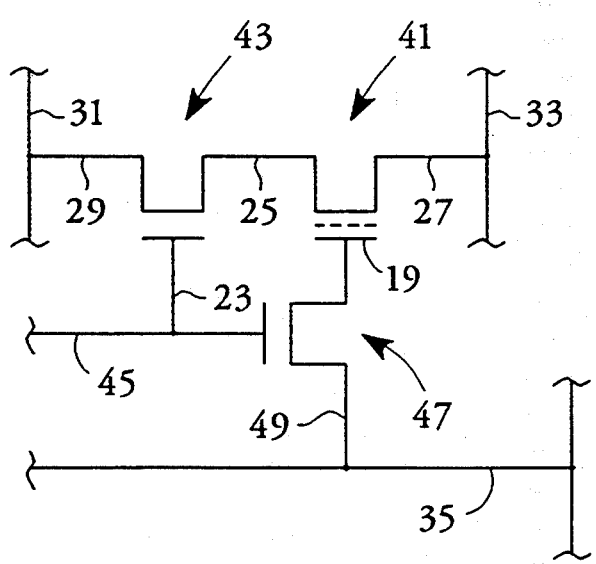

With reference to FIG. 3, a similar circuit structure is shown, except that there is an additional select transistor 47 having a source or drain electrode connected to the gate electrode of transistor 41. Transistor 47 is a sense select transistor with its gate connected to row select line 45. Electrode 49 may be considered as a block select or clear line useful when EEPROM transistors are operated in the flash mode. The additional transistors allow the memory cells to be addressed either individually or in a block erase mode.

Figure 4:
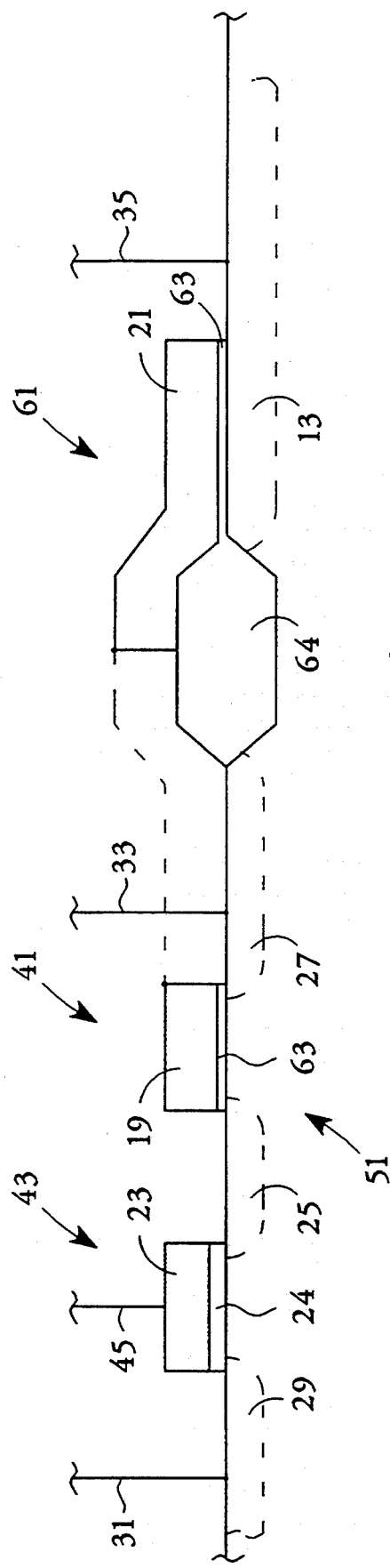
FIGS. 4 and 5 are sectional views of circuit constructions in accord with FIGS. 2 and 3.

FIG. 4 shows constructional details of the select transistor 43 and the sense transistor 41. The transistors are seen to be formed in a P-type substrate 51. Implanted drain 29 and implanted source 25, together with gate electrode 23 are the electrodes for the select transistor. Note that the gate electrode 23 is spaced apart from the substrate over an oxide layer 24 which is typically 300 angstroms thick. A row select line 45 is connected to the gate electrode. A first contact 31 is connected to the drain implant region 29. Implant region 25 serves as the drain of transistor 41. The source of transistor 41 is formed by implant region 27 having a contact 33. A gate portion 19 is part of a polysilicon layer which extends over to capacitor region 61. Polysilicon regions 19 and 21 are a single feature in practice. They are shown as two regions connected by a dashed line in this representation. This was done for simplicity so that all critical features could be shown in a single figure. A rectangular buried N-type region 13 forms a first plate of a parallel plate capacitor while the previously mentioned polysilicon layer forms a second spaced apart parallel plate 21 separated from the first parallel plate by a thin oxide layer 63. This can be either the same thin oxide layer which separates gate electrode 19 from electrodes 25 and 27 and from the substrate 51 or the thicker oxide which separates row select line 45 from regions 29, 25, and 51. The thickness of the oxide layer 63 is in the range of 50–120 angstroms, with a preferred value of approximately 80 angstroms. A contact 35 is attached to the subsurface rectangular region 13 which is capacitively coupled to the sense gate 19. Note that a field oxide region 64 separates the gate portion 19 from the capacitor portion 61, even though gate portion 19 and parallel plate region 21 are formed in the same polysilicon layer and are connected by a unitary structure as seen in FIG. 1.

Figure 5:
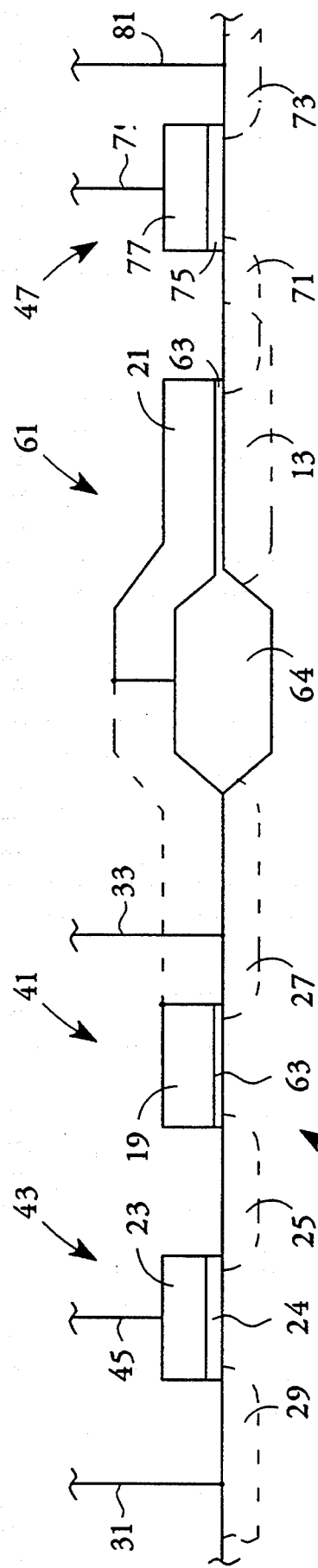

The structure of FIG. 5 is similar to the structure of FIG. 4, except that an additional select transistor 47 is fabricated for implementing block clear operations in certain EEPROM memory configurations. The transistor includes regions 71 and 73 which are N+ implanted zones in substrate 51. These implanted regions will form the source and drain for the transistor and are separated by a gate region over which gate oxide 75 is grown. The gate oxide is approximately 300 angstroms thick, and is grown at the same time as the gate oxide of transistor 43. Over the gate oxide the polysilicon region 77 is disposed which has the same thickness as the parallel plate polysilicon region 21 and the polysilicon gate portion 19 as well as the polysilicon stripe 23. Line 79 is a select gate line, while line 81 is a sense gate line corresponding to the third contact line 35 in FIG. 4. The sense gate line now operates through the transistor 47 in the manner of a pass transistor, except that the select transistor 47 is used to apply high voltage, typically 12 volts from the select gate 79 across electrode 71 for discharging the capacitor plate 21 relative to the rectangular plate 13 in the substrate through the thin oxide 63.

Figure 6:
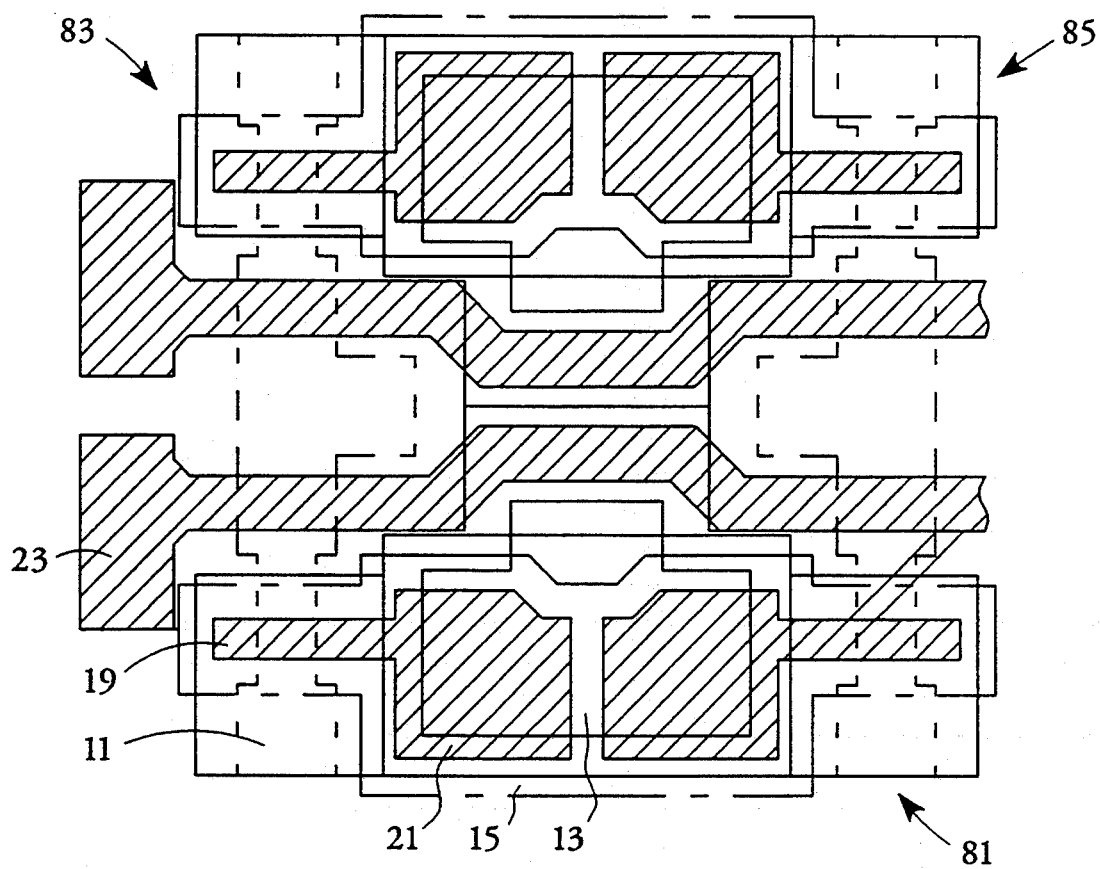
FIG. 6 is a top plan view of a portion of a wafer implementing the circuitry instruction shown in FIG. 1.

FIG. 6 corresponds to FIG. 1, except that four circuits are shown as a portion of a wafer. FIG. 1 is represented in the lower left-hand portion of FIG. 6 where the stripe 11 defining the active region may be seen together with gate portion 19 and parallel plate portion 21 of a polysilicon layer. The same polysilicon layer includes the polysilicon stripe 23. The thin layer oxide 15 may be seen as the outermost region forming the center of the parallel plate capacitor, as well as the thin oxide below gate portion 19. The lower capacitor plate, fabricated in the substrate is the innermost layer 13. The layer 13 is a buried N-type rectangle, or near rectangle, in the substrate. The design is repeated in the lower right quadrant 81 which has a left to right mirror symmetry with the lower left-hand portion. Similarly, the circuit layout is mirrored bottom to top in the upper left quadrant 83. In turn, the quadrant 83 is mirrored left to right in the upper right-hand quadrant 85. The four-fold symmetry of the EEPROM circuit configuration may be disposed over the entire surface of the wafer.

Figure 7:
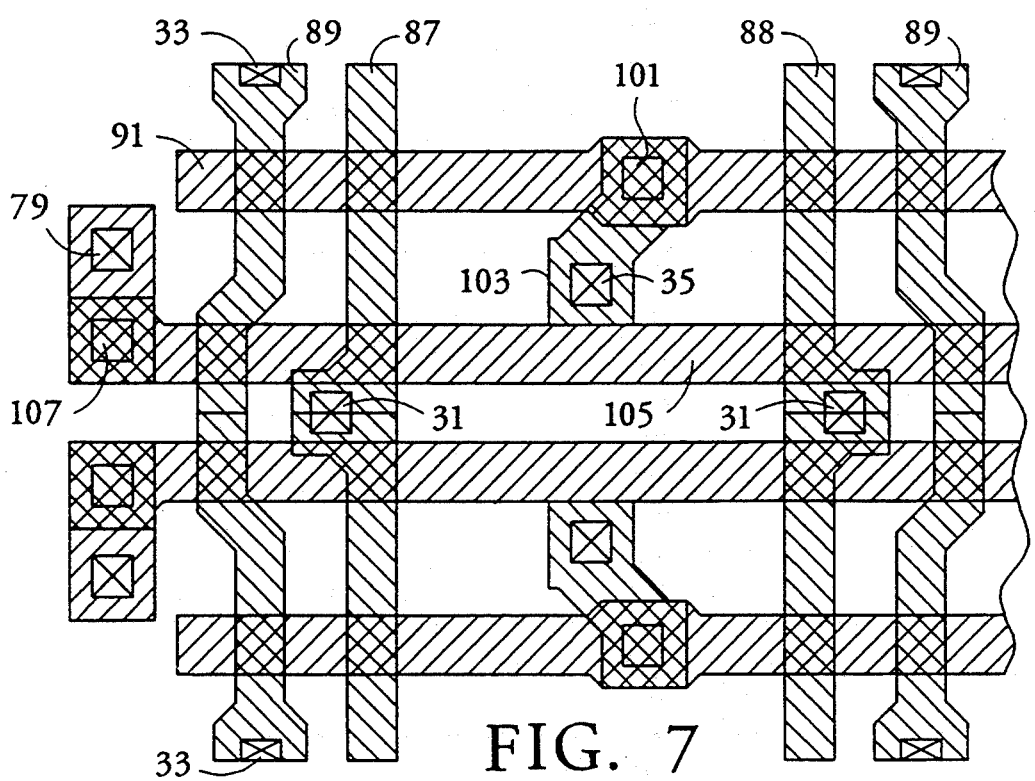
FIG. 7 is a metallization plan for the structure of FIG. 6.

Metallization for the layout of FIG. 6 is shown in FIG. 7. Lines 87 and 88 are bit lines with contacts 31 communicating with an implanted N+ region of the select transistor. $V_{SS}$ lines 89 have contacts 33, implemented by contacts, reaching a N+ implanted region associated with the sense transistor. While the vertical metallization pattern is one layer of metal, the horizontal pattern represents a second metallization layer. Line 91 is a sense gate line with a via 101 extending downwardly to contact line 103, deposited with the first metallization layer, including the lines 87 and 89. The metallization stripe 103 includes a contact 35 which reaches the subsurface region 13 of FIG. 6, one of the plates of the parallel plate capacitor.

Line 105 is a select gate line associated with the select transistor 47 in FIG. 5. A contact 79 through a via 107 reaches the select gate of this transistor.

In operation, without a block clear mode, consider the circuit shown in FIG. 2. The following voltages are applied to execute the designated operations:

|  |  | Bit Line 29 | Select Gate 23 | $V_{SS}$ Line 27 | Sense Contact 35 |
|---|---|---|---|---|---|
|  | Read | 2V | 5V | 0V | 1V |
| (low $V_T$) | Write 0 | 12V | 12V | Floating | 0V |
| (high $V_T$) | Write 1 | 0V | 12V | 0V | 12V |

The 1 volt shown applied to contact 35 during a read operation is selected to be between threshold voltages for programming the sense gate 19.

In operation, with a block clear mode, consider the circuit shown in FIG. 3. The following voltages are applied to execute the designated operations:

|  |  | Bit Line 29 | Select Gate 23 | $V_{SS}$ Line 27 | Sense Gate 49 | Select Gate 45 |
|---|---|---|---|---|---|---|
| (low $V_T$) | Block Clear | floating | 12V | 12V | 0V | 12V |

Note that the highest voltages, 12V, are substantially lower than high voltages used in the two layer polysilicon structures of the prior art, usually 18-20V. The memory cell of the present invention employs tunneling both for the write operation, high $V_T$, and the erase operation, low $V_T$. In the write operation, electrons tunnel through the entire channel of the inverted floating gate. In the erase operation, electrons tunnel through just the self-aligned drain-overlap region of the floating gate transistor 43. The shared thin oxide layer of the MOS transistor and lateral capacitor makes this possible.

We claim:

1. An EEPROM transistor of the type having a single polysilicon layer comprising:
an MOS transistor region, formed in a semiconductor substrate of a first conductivity type with a surface, having a generally linear subsurface active first stripe defined by a dopant of a second conductivity type, a second stripe of thin tunnel oxide adjoiningly traversing the first stripe, said second tunnel oxide having a thickness of at most 120 Å, a polysilicon third stripe having a portion traversing the first stripe parallel to and adjoining the second stripe, substantially all of the portion separated from the first stripe by essentially only the second stripe, with implanted ion source and drain regions disposed in the first stripe aligned on opposite lateral sides of the third stripe, the third stripe functioning as a gate electrode relative to the source and drain,
a capacitor region formed in the semiconductor substrate adjacent to the transistor region having a subsurface active first plate of a parallel plate capacitor, defined by dopant of the second conductivity type, an insulative second plate of thin oxide over the first plate, said second plate of thin oxide having a thickness substantially equal to that of said second stripe, said second plate of thin oxide extending to and connecting with said second stripe of thin tunnel oxide to form a single thin oxide layer with substantially uniform thickness throughout and a third plate of polysilicon parallel to and disposed over the first and second plates and joining the third stripe distal to the portion, wherein the third stripe and the connected third plate are defined within a perimeter of the second stripe and connected second plate such that said third stripe and said connected third plate overlie only said thin oxide of said second stripe and connected second plate the third plate serving as a charge storage member.

2. The device of claim 1 wherein the first stripe comprises N-type material.

3. The device of claim 1 further comprising a second transistor sharing said subsurface active first stripe of said transistor region of the MOS transistor, one of the ion implanted source and drain regions serving as a first electrode of the second transistor and having a polysilicon stripe functioning as a gate electrode parallel to the third stripe of the MOS transistor region.

4. The device of claim 3 further comprising a second transistor ion implanted region on an opposite side of the polysilicon stripe from the one of the ion implanted source and drain regions.

5. The device of claim 4 further comprising a bit line contact contacting the second transistor ion implanted region.

6. The device of claim 5 further comprising a bias means contacting the subsurface active first stripe on an opposite side of the third stripe from the one of the implanted source and drain regions.

7. The device of claim 1 further comprising a third transistor having a subsurface source and drain electrodes and a gate electrode, one of said subsurface electrodes overlapping said subsurface active first plate whereby signals applied to said gate electrode can influence said charge storage member.

8. The device of claim 7 wherein said gate electrode is polysilicon coplanar with said third stripe.

9. An EEPROM transistor array of the type having a single polysilicon layer comprising,
a semiconductor substrate of a first conductivity type with a surface having a plurality of generally parallel linear subsurface first stripes defined by a dopant of a second conductivity type,
second stripes of thin tunnel oxide transverse to the first stripes and disposed on said surface,
third stripes of polysilicon disposed parallel to and over the second stripes, separated from said first stripes by essentially only said second stripes,
implanted ion source and drain regions disposed in the first stripes aligned on opposite lateral sides of the third stripes, the third stripes functioning as gate electrodes relative to the sources and drains, thereby forming a plurality of MOS transistors,
a plurality of parallel plate capacitors, each adjacent to one of the MOS transistors and having a first plate with a subsurface active region defined by said dopant of the second conductivity type, an insulative second plate of thin oxide over the first plate, and a third plate of polysilicon parallel to and disposed over the first and second plates with extensions of the second and third plates joining said second and third stripes, respectively, each second plate and joined second stripe together forming a single thin oxide layer of substantially uniform thickness of at most 120 Å, the third plate serving as a charge storage member, wherein each transistor and associated capacitor has symmetry with other transistors and connected capacitors about both a first line substantially parallel with and a second line substantially perpendicular to said first stripes.

10. The device of claim 9 further comprising a plurality of metal stripes generally parallel to the first stripes for electrical contact with the device, 11. The device of claim 9 further comprising a plurality of metal stripes generally parallel to the second stripes for electrical contact with the device, 12. The device of claim 9 further comprising a plurality of first metal stripes generally parallel to said first stripes and a plurality of second metal stripes generally parallel to said second stripes.

* * * * *